United States Patent [19]

Yanagisawa

[11] Patent Number: 5,018,100
[45] Date of Patent: May 21, 1991

[54] SEMICONDUCTOR MEMORY DEVICE

[75] Inventor: Kazumasa Yanagisawa, Kokubunji, Japan

[73] Assignee: Hitachi, Ltd., Tokyo, Japan

[21] Appl. No.: 420,016

[22] Filed: Oct. 11, 1989

[30] Foreign Application Priority Data

Oct. 11, 1988 [JP] Japan .................. 63-255371

[51] Int. Cl.5 .............................. G11C 8/02
[52] U.S. Cl. .................. 365/230.03; 365/51; 365/63
[58] Field of Search ............ 365/51, 63, 230.03

[56] References Cited

U.S. PATENT DOCUMENTS 3,942,164  3/1976  Dunn .................... 365/63
4,796,235  1/1989  Itoh et al. ............. 365/63

FOREIGN PATENT DOCUMENTS

56-130886  10/1981  Japan .
58-50698   3/1983   Japan .
60-145594  8/1985   Japan .
63-10396   1/1988   Japan .
63-148489  6/1988   Japan .
63-183691  7/1988   Japan .
63-119395  8/1988   Japan .
63-225991  9/1988   Japan .

Primary Examiner—Joseph E. Clawson, Jr.
Attorney, Agent, or Firm—Fay, Sharpe, Beall, Fagan, Minnich & McKee

[57] ABSTRACT

A semiconductor memory device comprising first and second memory arrays disposed adjacent to one another in such a manner as to form a pair and first and second common data lines disposed in such a manner as to cross one another at a predetermined position and connected selectively to designated ones of data lines of said first or second memory array on both sides of said predetermined position on both sides of the extension direction thereof.

25 Claims, 5 Drawing Sheets

SEMICONDUCTOR MEMORY DEVICE

BACKGROUND OF THE INVENTION

This invention relates to a semiconductor memory device and more particularly to a technique which will be particularly useful when utilized for a dynamic RAM (Random Access Memory) employing a split array system, for example.

Those dynamic RAMs are available which use, as their basic structure, a memory array including a plurality of word lines and complementary data lines disposed to cross mutually and orthogonally and a plurality of dynamic memory cells disposed in matrix at the points of intersection of these word lines and complementary data lines. A so-called "split array system" which splits the memory array in an extension direction of the complementary data lines and selectively activates the arrays in accordance with address signals is also known as one of the means for improving the operation speed of such dynamic RAMs and for reducing their power consumption.

The dynamic RAM employing the split array system is disclosed, for example, in Japanese Patent Laid-Open No. 293589/1987.

In the conventional dynamic RAM employing such a split array system, a plurality of row address decoders, sense amplifiers, column switches, complementary common data lines, and the like, are disposed in such a manner as to correspond to the memory arrays after splitting, and a write/read circuit such as a main amplifier is disposed to correspond to each complementary common data line.

The number of splitting of memory array is set to an optimal number in consideration of the effect brought forth by the array splitting and the influences on the chip area due to the increase in the number of sense amplifiers and the like. The memory arrays after splitting are selectively activated in accordance with a predetermined address signal to reduce power consumption of the dynamic RAM. However, substantial efficiency of utilization of the complementary common data lines drops because the memory arrays are selectively activated.

On the other hand, the data that is inputted or outputted at one time has turned to a multi-bit with the increase in the capacity of the dynamic RAM and in this point, too, the advantage of the split array system described above is exhibited. If the split number of the memory array is determined by giving priority to the multi-bit structure, however, the optimal condition described above cannot be satisfied and the number of the arrays that are activated simultaneously increases.

SUMMARY OF THE INVENTION

Figure 5:
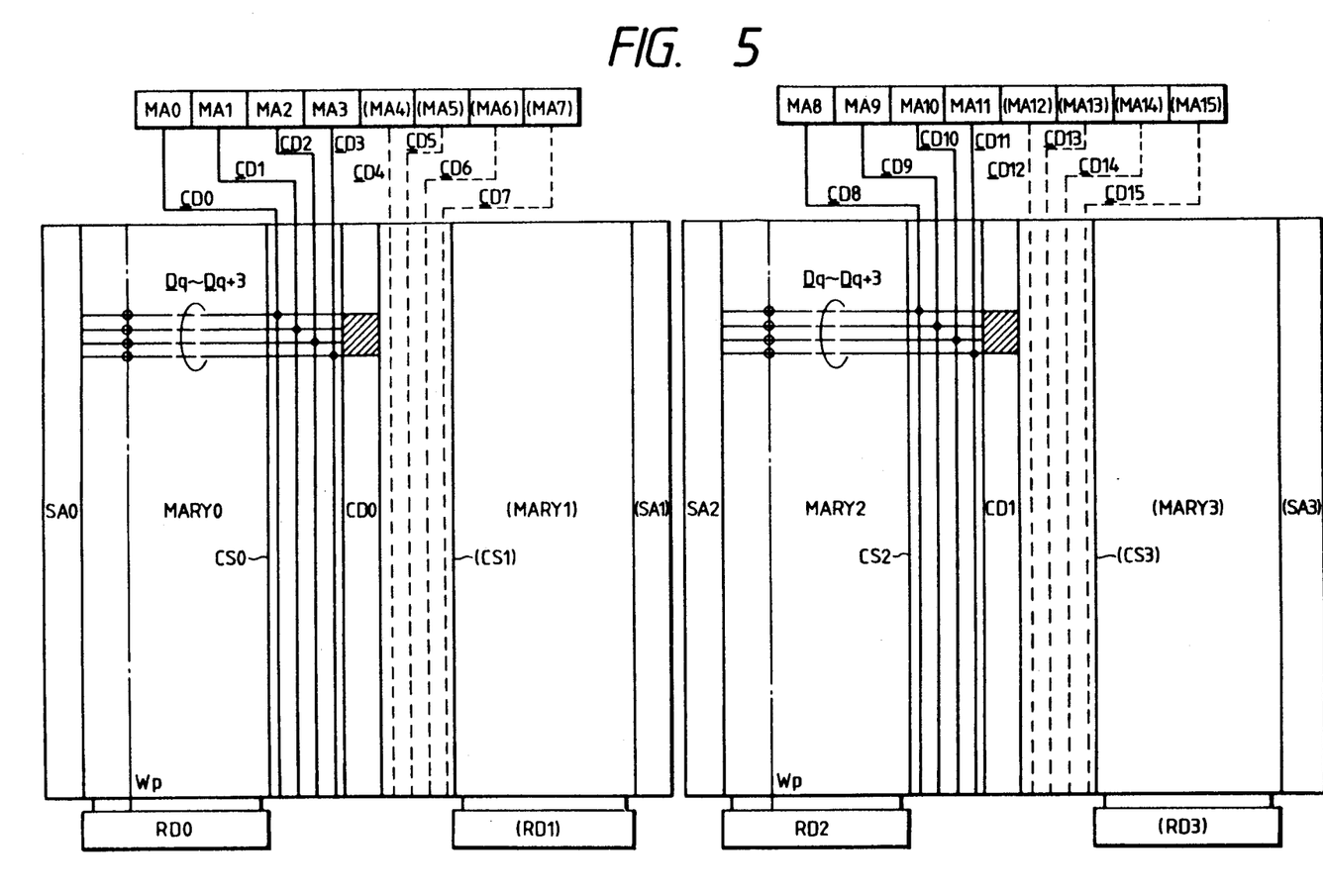
FIG. 5 is a conceptual view showing an example of the connection state of a dynamic RAM.

Accordingly, the inventors of the present invention have developed a method which disposes a plurality of complementary common data lines for each split array and selects simultaneously a plurality of memory cells from each split array as shown in FIG. 5 of the accompanying drawings.

In the dynamic RAM shown in FIG. 5, there are disposed two pairs of memory arrays MARY0 and MARY1, and MARY2 and MARY3, and one of each pair is selectively activated. Four sets of complementary common data lines $\underline{CD0} \sim \underline{D3}$ through $\underline{CD12} \sim \underline{CD15}$ (where $\underline{CD0}$ represents together a non-inverted common data line CD0 and an inverted common data line $\overline{CD0}$ and this also holds true of other complementary common data lines and complementary signals, too) are disposed in such a manner as to correspond to these memory arrays MARY0 ~ MARY3.

In the dynamic RAM shown in FIG. 5, two memory arrays MARY0 and MARY2 are simultaneously activated. Four memory cells connected to word lines Wp, that is, the complementary data lines $\underline{Dq} \sim \underline{Dq+3}$, are simultaneously selected from these memory arrays and are connected to the corresponding complementary common data lines $\underline{CD0} \sim \underline{CD3}$ and $\underline{CD8} \sim \underline{CD11}$, respectively. As a result, a dynamic RAM having a so-called "8-bit structure" capable of inputting or outputting simultaneously 8-bit memory data can be accomplished while limiting the split number of the memory array to 4.

However, the inventor of the present invention has found out that the following problem is left yet unsolved in the dynamic RAM described above. In the dynamic RAM described above, four sets of complementary common data lines are disposed so as to split each memory array as described above and these complementary common data lines and corresponding switch MOSFET groups are disposed with predetermined gap between them and moreover, from the upper end to the lower end of each memory array. Therefore, the necessary layout area of column switches CS0 ~ CS3 including the complementary common data lines and the switch MOSFETs increases and the reduction of the cost of production of the dynamic RAM is inhibited.

It is therefore a first object of the present invention to improve utilization efficiency of the common data lines disposed in the dynamic RAM or the like.

It is a second object of the present invention to reduce the necessary layout area of column switch peripheral portions of the dynamic RAM or the like.

It is a third object of the present invention to attain a multi-bit structure of the dynamic RAM or the like without hindering the reduction of the cos of production.

These and other objects and novel features of the present invention will become more apparent from the following description when taken in conjunction with the accompanying drawings.

Among the inventions disclosed in this application, the following will briefly illustrate a typical invention. In a dynamic RAM or the like employing a split array system, common data lines of two memory arrays disposed adjacent to each other in such a manner as to form a pair are crossed at intermediate point in their extension direction. A plurality of corresponding data lines of one of the memory arrays which is activated are simultaneously connected to each common data line on both sides of the intermediate point. In this manner, the two memory arrays disposed adjacent to each other and forming the pair can share the common data line. For this reason, utilization efficiency of the common data lines can be improved equivalently and the number of installation of necessary common data lines can be reduced. As a result, the necessary layout area of the column switch including the common data lines and the switch MOSFET group can be reduced and thus the multi-bit structure of the dynamic RAM can be accomplished without hindering the reduction of its cost of production.

DESCRIPTION OF THE PREFERRED EMBODIMENTS

Figure 1:
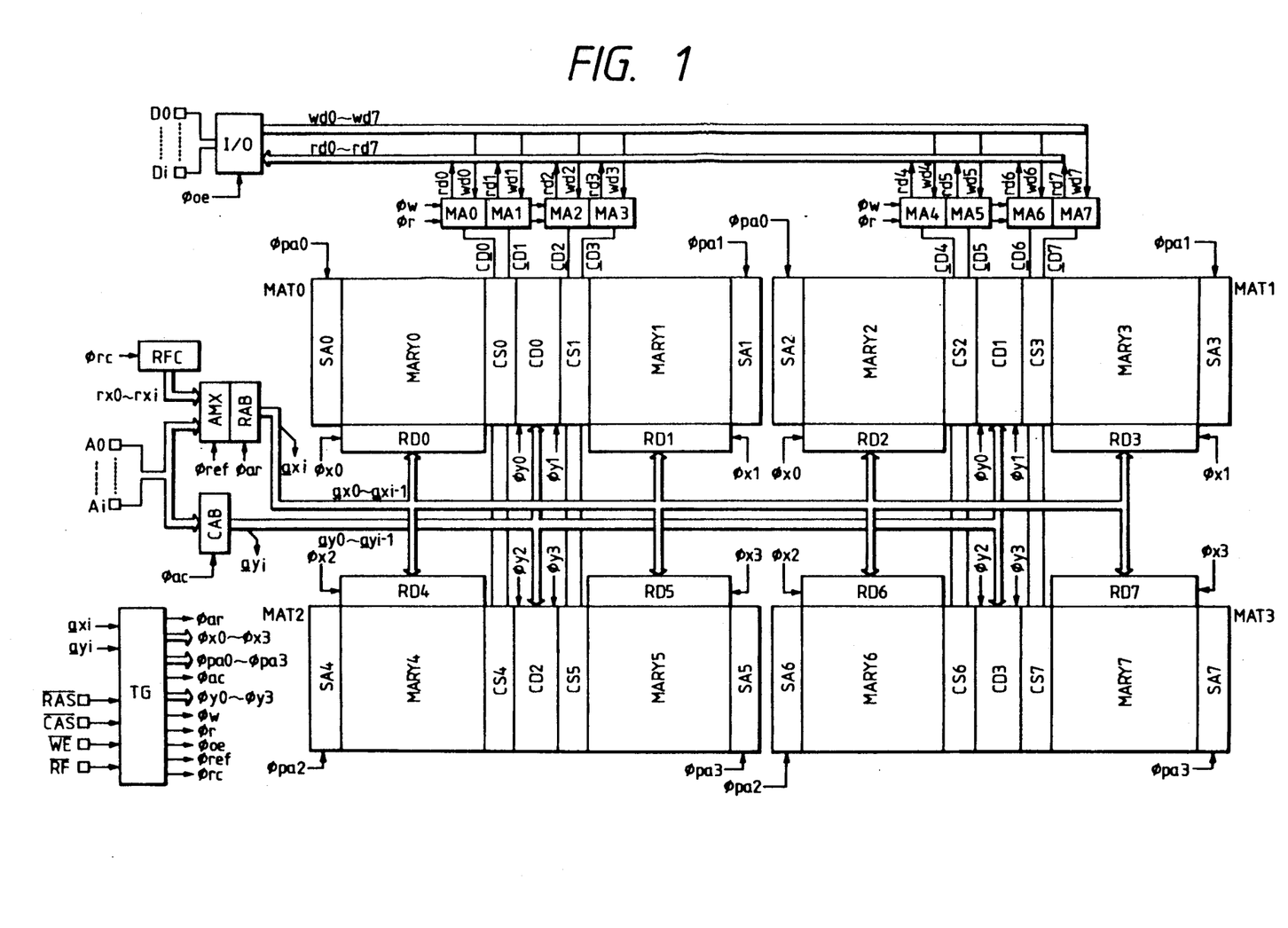
FIG. 1 is a block diagram showing a dynamic RAM in accordance with one embodiment of the present invention.
Figure 2:
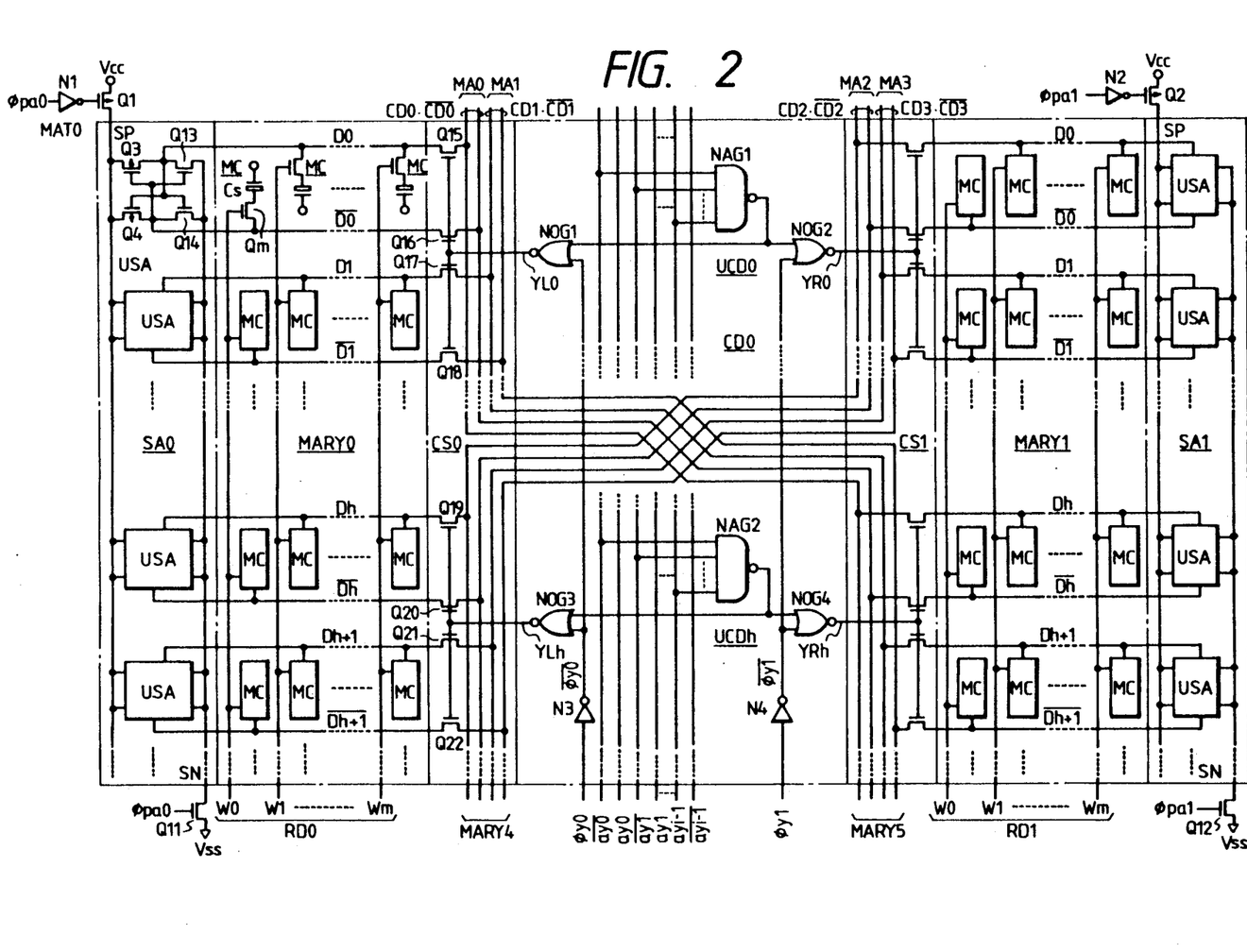
FIG. 2 is a partial circuit diagram showing the memory arrays of the dynamic RAM of FIG. 1 and its peripheral circuit.
Figure 3:
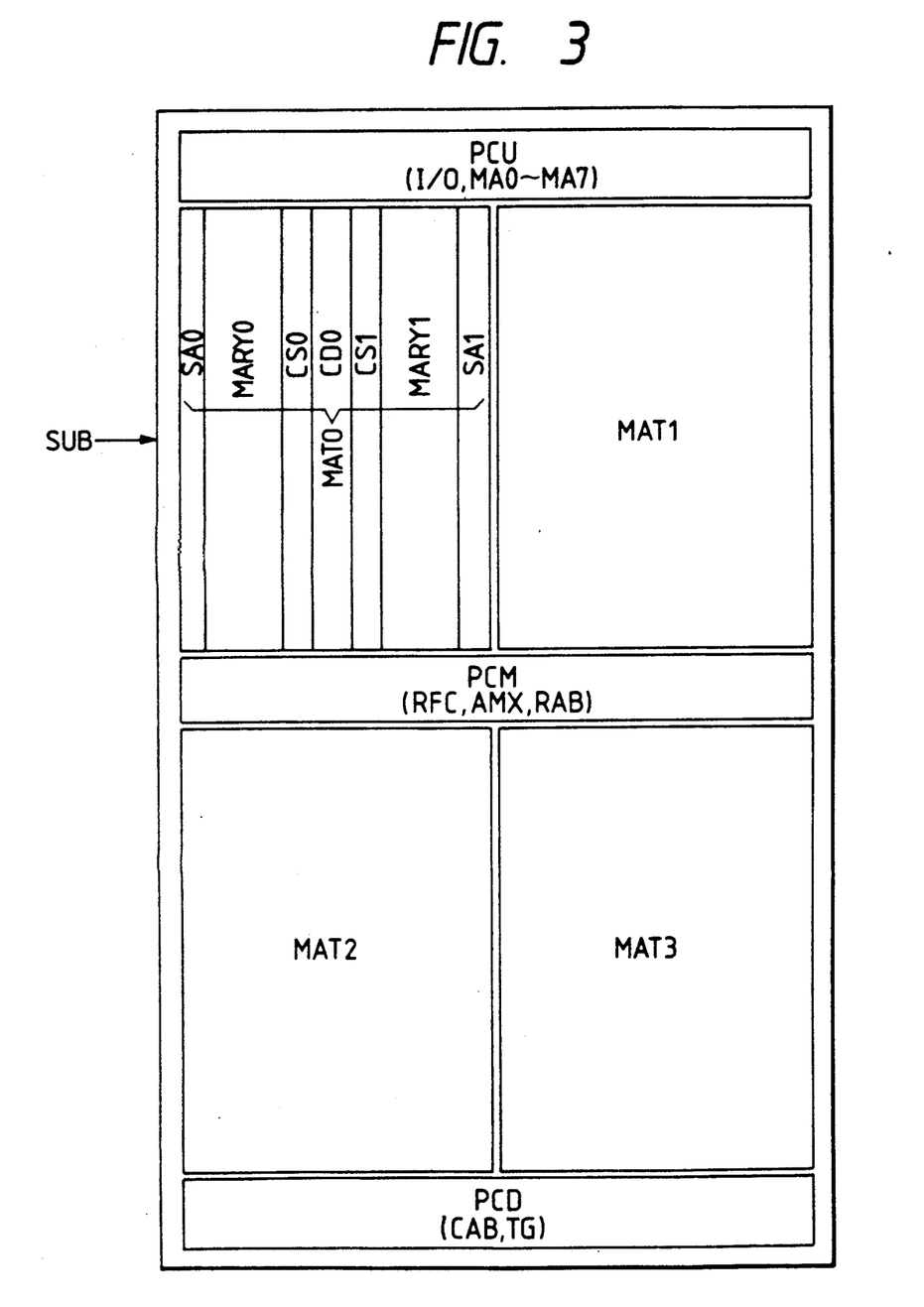
FIG. 3 is a disposition diagram of the dynamic RAM of FIG. 1.
Figure 4:
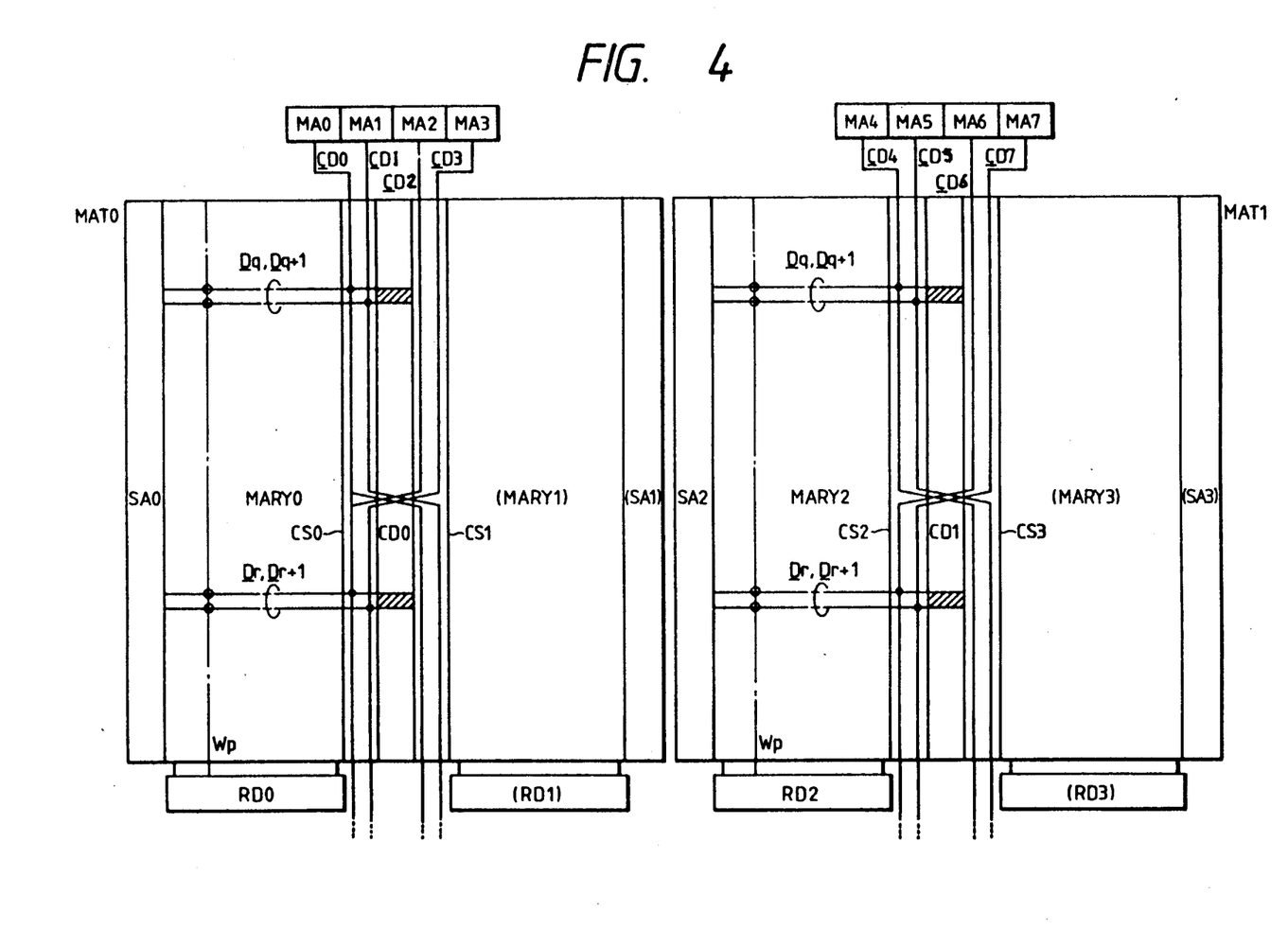
FIG. 4 is a conceptual view showing the connection state of the dynamic RAM of FIG. 1.

FIG. 1 shows a block diagram of the dynamic RAM in accordance with one embodiment of the present invention and FIG. 2 shows a partial circuit diagram of the memory arrays of the dynamic RAM and their direct peripheral circuit. FIG. 3 shows the disposition diagram of the dynamic RAM in FIG. 1 on a semiconductor substrate SUB in one embodiment and FIG. 4 is a conceptual view showing the connection state of the dynamic RAM in FIG. 1. The construction and operation of the dynamic RAM of this embodiment will be described with reference to these drawings.

Each circuit device of FIG. 2 and each circuit device constituting each circuit block of FIG. 1 are formed on one semiconductor substrate SUB such as single crystal silicon, though this is not particularly limitative, by known fabrication technique of semiconductor integrated circuitry. In FIG. 2, those MOSFETs (Metal Oxide Semiconductor Field Effect Transistors) which are provided with arrows at their channel (back gate) are P-channel MOSFETs and are distinguished from N-channel MOSFETs not having such an arrow.

In FIG. I, the dynamic RAM of this embodiment is equipped with four memory mats MAT0~MAT3, though this is not particularly limitative. These memory formats form pairs by the combination of upper and lower mats, that is, the memory mats MAT0 with MAT2 and the memory mats MAT1 with MAT3, and share corresponding four sets of complementary data lines $\overline{CDO} \sim \overline{CD3}$ and $\overline{CD4} \sim \overline{CD7}$, respectively.

Though not particularly limitative, these memory mats MAT0~MAT3 each include a column address decoder CDO~CD3, and a pair of memory arrays MARY0 (first memory array) and MARY1 (second memory array) through MARY6 (first memory array) and MARY7 (second memory array) that are disposed in such a manner as to interpose the column decoder, respectively. Each of the memory mats includes a row address decoder RD0 (first row address decoder), RD1 (second row address decoder) through RD6 (first row address decoder), RD7 (second row address decoder), sense amplifiers SA0 (first sense amplifier) and SA1 (second sense amplifier) through SA6 (first sense amplifier) and SA7 (second sense amplifier) and column switches CS0 and CS1 through CS6 and CS7 that are disposed in such a manner as to correspond to the memory arrays MARY0 through MARY7, respectively.

Among them, two each column address decoders CD0~CD3 are activated selectively and simultaneously in accordance with timing signals $\phi y0 \sim \phi y3$ and in the combinations of the column address decoders CD0 with CD1 or CD2 with CD3 as will be described later, whereby two each column switches CS0 and CS2 or CS4 and CS6 or CS1 and CS3 or CS5 and CS7 on the left or right side of them are simultaneously activated. Similarly, two each row address decoders RD0~RD7 are activated selectively and simultaneously in accordance with timing signals $\phi x0 \sim \phi x3$ in the combination of the row address decoders RD0 with RD2 or RD4 with RD6 or RD1 with RD3 or RD5 with RD7.

Two each sense amplifiers SA0~SA7 are activated selectively and simultaneously in accordance with timing signals $\phi pa0 \sim \phi pa3$ in the combination of the sense amplifiers SA0 with SA2 or SA4 with SA6 or SA1 with SA3 or SA5 with SA7. As a result, two each memory mats MAT0~MAT3 are activated simultaneously in the combinations of the memory mats MAT0 with MAT1 or MAT2 with MAT3, whereby two each memory arrays disposed on the left or right side of them are activated selectively and simultaneously in the combination of the memory arrays MARY0 with MARY2 or MARY4 with MARY6 or MARY1 with MARY3 or MARY5 with MARY7.

As will be described elsewhere, the timing signals $\phi y0 \sim \phi y3$, $\phi x0 \sim \phi x3$ and $\phi pa0 \sim \phi pa3$ are selectively generated in accordance with the Y address signal AYi and X address signal AXi of the most significant bit. In the dynamic RAM of this embodiment, therefore, the upper memory mats MAT0 and MAT1 or the lower memory mats MAT2 and MAT3 are activated selectively and simultaneously in accordance with the Y address signal AYi of the most significant bit, and the memory arrays on the left side of each memory mat, i.e. MARY0 and MARY2 or MARY4 and MARY6 or the memory arrays on the right side MARY1 and MARY3 or MARY5 and MARY7 are activated selectively and simultaneously in accordance with the X address signal AXi of the most significant bit.

The memory array MARY0 constituting the memory mat MAT0 includes m+1 word lines W0~Wm disposed in parallel with one another in a vertical direction, n+1 sets of complementary data lines $\overline{D0} \sim \overline{Dn}$ disposed in parallel with one another in a horizontal direction and (m+1)×(n+1) dynamic memory cells disposed in matrix at the points of intersection between these word line and complementary data lines as shown in FIG. 2, though this structure is not particularly limitative. The memory array MARY1 constituting the memory mat MAT0 with the memory array MARY0 has a symmetric construction with the memory array MARY0. The memory arrays forming the pair, i.e. MARY2 and MARY3 or MARY6 and MARY7 have the construction corresponding to the memory arrays MARY0 and MARY1 described above and constitute the corresponding memory mats MAT1~MAT3, respectively. Hereinafter, the construction and operation of the memory array of the dynamic RAM of this embodiment and those of its direct peripheral circuits will be explained about the memory mat MAT0 by way of example. The construction and operation of the other memory mats MAT1~MAT3 could be understood from this explanation.

Each dynamic memory cell MC constituting the memory array MARY0, MARY1 of the memory mat MAT0 includes a data storage capacitor Cs and an address selection MOSFET Qm that are connected in series as shown in FIG. 2, though this arrangement is not particularly limitative. The drains (input/output nodes) of the address selection MOSFETs Qm of m+1 memory cells MC that are disposed in the same column of each memory array are connected alternately with predetermined regularity to the non-inversion signal lines $D0 \sim Dn$ of the corresponding complementary data lines or to their inversion signal lines $\overline{D0} \sim \overline{Dn}$. The gates (selection nodes) of the address selection MOSFETs Qm of n+1 memory cells MC that are disposed in the same row of each memory array are connected commonly to the corresponding word lines $W0 \sim Wm$. A predetermined cell plate voltage is supplied to the other electrode of the data storage capacitor Cs of each memory cell MC, though this is not particularly limitative.

The word lines $W0 \sim Wm$ constituting the memory arrays MARY0 and MARY1 of the memory mat MAT0 are connected to the corresponding row address decoder RD0 or RD1 and are brought alternatively into the selection state. Though not particularly limitative, i-bit complementary internal address signals $ax0 \sim axi\text{-}1$ are supplied from a RAB, row address buffer RAM, to the row address decoders RD0 and RD1. These complementary internal address signals $ax0 \sim axi\text{-}1$ are supplied commonly to other row address decoders $RD2 \sim RD7$. The timing signal $\phi x0$ or $\phi x1$ is supplied to the row address decoders RD0 and RD1 from a timing generation circuit TG.

When the timing signal $\phi x0$ or $\phi x1$ is at the high level, the row address decoders RD0 or RD1 are selectively activated. Under this operative state, the row address decoders RD0 and RD1 decode the complementary internal address signals $a0 \sim axi\text{-}1$ and set the corresponding word lines of the memory array MARY0 or MARY1 alternatively to the high level selection state. As described already, two of the row address decoders $RD0 \sim RD7$ are activated selectively and simultaneously in accordance with the timing signals $\phi x0 \sim \phi x3$. In the dynamic RAM of this embodiment, therefore, two word lines corresponding to the complementary internal address signals $ax0 \sim axi\text{-}1$ are selected simultaneously in the corresponding two memory arrays and these memory arrays are simultaneously activated.

The row address buffer RAB accepts and latches the row address signal transmitted thereto through an address multiplexer AMX in accordance with the timing signal $\phi ar$ supplied from the timing generation control circuit TG, though this arrangement is not particularly limitative. It generates the (i+1)-bit complementary internal address signals $ax0 \sim \overline{Axi}$ on the basis of these row address signals. The complementary internal address signal $axi$ of the most significant bit is supplied to the timing generation circuit TG, though this is not particularly limitative, and the remaining complementary internal address signals $ax0 \sim axi\text{-}1$ are supplied commonly to the row address decoders $RD0 \sim RD7$.

X address signals $AX0 \sim AXi$ that are supplied on the time division basis through the external terminals $A0 \sim Ai$ are inputted to one of the input terminals of the address multiplexer AMX and refresh address signals $rx0 \sim rxi$ are inputted from a refresh address counter RFC to the other input terminal. A timing signal $\phi ref$ is supplied as a selection control signal from the timing generation circuit TG to the address multiplexer AMX. Here, the timing signal $\phi ref$ is at the low level when the dynamic RAM is in the normal read or write mode and is at the high level when the dynamic RAM is in the refresh mode.

When the timing signal $\phi ref$ described above is at the low level, the address multiplexer AMX selects the X address signals $AX0 \sim AXi$ supplied through the external terminals $A0 \sim Ai$ and transmits it as a row address signal to the row address buffer RAB. When the timing signal $\phi ref$ is at the high level, it selects the refresh address signals $rx0 \sim rxi$ supplied from the refresh address counter RFC and transmits it as a row address signal to the row address buffer RAB.

Though not particularly limitative, the refresh address counter RFC is selectively activated when the dynamic RAM is in the refresh mode. Under this operative state, the refresh address counter RFC increments in accordance with the timing signal orc supplied from the timing generation circuit TG and generates the refresh address signals $rx0 \sim rxi$ described above. These refresh address signals $rx0 \sim rxi$ are supplied to the other input terminal of the address multiplexer AMX as described already.

The complementary data lines $0 \sim Dn$ constituting the memory arrays MARY0 and $\overline{MARY1}$ of the memory mat MAT are connected on one hand to the corresponding unit amplifier circuits of the sense amplifier SA0 or SA1 as typically shown in FIG. 2, and connected on the other hand to the corresponding switch MOSFETs of the column switch CS0 or CS1, though this arrangement is not particularly limitative.

Each unit amplifier circuit USA of the sense amplifier SA0, SA1 includes two CMOS inverter circuits consisting of a P-channel MOSFET Q3 with an N-channel MOSFET Q13 and a P-channel MOSFET Q4 and an N-channel MOSFET Q14 as shown in FIG. 2, though this is not particularly limitative. The input terminals of these CMOS inverter circuits are mutually crossconnected to their output terminals in the latch form.

The power source voltage $V_{cc}$ of the circuit is applied to the (n+1) unit amplifier circuits USA constituting the sense amplifier SA0 through a P-channel driving MOSFET Q1 and a common source line SP, while the ground potential $V_{ss}$ of the circuit is applied thereto through an N-channel driving MOSFET Q11 and a common source line SN, though this arrangement is not particularly limitative. The timing signal $\phi pa0$ from the timing generation circuit TG is applied to the gate of the driving MOSFET Q11 described above and an inverted signal of the timing signal $\phi pa0$ by the inverter circuit N1 is applied to the gate of the driving MOSFET Q1. Similarly, the power source voltage $V_{cc}$ of the circuit is supplied to the (n+1) unit amplifier circuits constituting the sense amplifier SA1 through a P-channel driving MOSFET Q2 and a common source line SP and the ground potential $V_{ss}$ of the circuit is supplied thereto through an N-channel driving MOSFET Q12 and a common source line SN. The timing signal opa1 from the timing generation circuit TG is supplied to the gate of driving MOSFET Q12 and the inverted signal of the timing signal opa1 described above by the inverter circuit N2 is supplied to the gate of the driving MOSFET Q2.

The timing signals $\phi pa0$ and $\phi pa1$ are at the low level when the dynamic RAM is under the non-selected state and are set selectively to the high level in accordance with the complementary internal address signals $axi$ and $\overline{axi}$ of the most significant bit at a predetermined timing a described already when the dynamic RAM is under the selected state.

When the dynamic RAM is under the selected state and the timing signal opa0 is at the high level, the driving MOSFETs Q1 and Q11 are turned ON in the memory mat MAT0 and the unit amplifier circuits USA of the sense amplifier SA0 are altogether activated. Immediately before this operation, the row address decoder RD0 is activated in the memory mat MAT0 and the designated word lines of the memory array MARY0 are brought into the selected state alternatively. Similarly, when the dynamic RAM is under the selected state and the timing signal opal is at the high level, the driving MOSFETs Q2 and Q12 are turned ON and the unit amplifier circuits USA of the sense amplifier SA1 are altogether activated. Immediately before this operation, the row address decoder RD1 is activated in the memory mat MAT0 and the designated word lines of the memory array MARY1 are alternatively brought into the selected state.

Each unit amplifier circuit of the sense amplifier SA0 or SA1 which is activated amplifies a very weak read signal outputted from the (n+1) memory cells MC connected to the selected word line of the memory array MARY0 or MARY1 through the corresponding complementary data lines and generates a binary read signal of a high or low level.

Though not particularly limitative, each column switch SC0, SC1 includes (n+1) pairs of switch MOSFETs Q15, Q16 and Q71, Q18 ~Q19, Q20 and Q21, Q22 disposed in such a manner as to correspond to the complementary data lines $\underline{D0} \sim \underline{Dn}$ of the memory array MARY0 or MARY1 as shown typically in FIG. 2. One of the input/output nodes o each of these switch MOSFETs is connected to the corresponding complementary data lines $\underline{D0} \sim \underline{Dn}$ and the other, commonly to one line of the corresponding two sets of complementary common data lines $\underline{CD0}$ and $\underline{CD1}$ (first common data line) or $\underline{CD2}$ and $\underline{CD3}$ (second common data line) with predetermined regularity, respectively.

In the dynamic RAM of this embodiment, the complementary common data lines $\underline{CD0}$ $\underline{CD1}$ and $\underline{CD2}$, $\underline{CD3}$ are disposed in such a manner that common data lines CD0, CD1 have first and second portions aligned and parallel to the second and first portions of common data lines CD2, CD3, and all parallel to the word selection lines W0 ... Wm. The first and second portions are joined by connecting portions that cross mutually at their intermediate portions as shown in FIG. 2. One of them is connected to the corresponding main amplifier MA0 and MA1 (first main amplifier) and the other is connected to MA2 and MA3 (second main amplifier), while each is extended to the corresponding memory array MARY4 or MARY5 of the memory mat 2 and is disposed in such a manner to cross one another at the intermediate portions of these memory arrays. This disposition method also holds true of the complementary common data lines CD4, CD5 and CD6, CD7. In other words, in the dynamic RAM of this embodiment, two sets of complementary common data lines are disposed so as to correspond to each memory array and these complementary common data lines are disposed in such a manner as to cross one another at their intermediate portions so that they are shared commonly by the two memory arrays disposed adjacent to each other to form a pair and by the two memory mats forming a vertical pair, too.

Accordingly, among the complementary data lines $\underline{D0} \sim \underline{Dn}$ of the memory array MARY0, the other input/output nodes of the (n+1)/2 pairs of switch MOSFETs Q15, Q16 and Q17, Q18, etc., corresponding to the complementary data lines $\underline{D0} \sim \underline{Dn}-1$ disposed at the upper half of the memory array MARY0 are connected sequentially and commonly to the non-inversion signal lines and inversion signal lines of the complementary data lines $\underline{CD0}$ and $\underline{CD1}$. The gates of two sets each of these switch MOSFETs are commonly connected and the corresponding data line selection signals YL0-~YLh−2 are supplied to them from the column address decoder CD0. On the other hand, the other input/output nodes of the (n+1)/2 switch MOSFETs Q19, Q20 and Q21, Q22, etc., corresponding to the complementary data lines $\underline{Dh} \sim \underline{Dn}$ disposed at the lower half of the memory array MARY0 are connected sequentially and commonly to the non-inversion signal lines and inversion signal lines of the complementary common data lines $\underline{CD2}$ and $\underline{CD3}$. The gates of two sets each of these switch MOSFETs are connected commonly to one another and the corresponding data line selection signals YLh~YLn−1 are supplied from the column address decoder CD0.

Similarly, the other input/output nodes of the (n+1)/2 pairs of switch MOSFETs Q15, Q16 and Q17, Q18, etc. corresponding to the complementary data lines $\underline{D0} \sim \underline{Dh}-1$ disposed at the upper half of the memory array MARY1 are connected sequentially and commonly to the non-inversion signal lines and inversion signal lines of the complementary common data lines $\underline{CD2}$ and $\underline{CD3}$. The gates of two sets each of these switch MOSFETs are connected commonly, and the corresponding data line selection signals YR0-~YRh−2 are supplied to them from the column address decoder CD0. On the other hand, the other input/output nodes of the (n+1)/2 pairs of switch MOSFETs Q19, Q20 and Q21, Q22, etc., corresponding to the complementary data lines $\underline{Dh} \sim \underline{Dn}$ disposed at the lower half of the memory array MARY1 are connected sequentially and commonly to the non-inversion signal lines and inversion signal lines of the complementary common data lines $\underline{CD0}$ and $\underline{CD1}$, and the corresponding data line selection signals YRh~YRn−1 are supplied to them from the column address decoder CD0.

Here, the data line selection signals YL0~YLh−2, YLh~YLn−1, YR0 ~YRh−2 and YRh ~YRn−1 are set selectively and simultaneously to the high level to form pairs, respectively, in accordance with the timing signals $\phi y0$ and $\phi y1$ and the complementary internal address signals $a0 \sim ai-1$ as will be described later. In other words, the data line selection signals YL0, YLh and YLh−2, YLn−1 are set to the high level selectively and simultaneously in accordance with the complementary internal address signals $a0 \sim ai-1$ on the condition that the timing signal $\phi y0$ is at the high level. Similarly, the data line selection signals YR0 and YRh through RYh−2 and YRn−1 are set to the high level selectively and simultaneously in accordance with the complementary internal address signals $a0 \sim ai-1$ on the condition that the timing signal $\phi y1$ is at the high level.

When the timing signal $\phi y0$ is at the high level and the data line selection signals YL0 and YLh through YLh−2 and YLn−1 are set to the high level selectively and simultaneously in the column address decoder CD0 of the memory mat MAT0, upper and lower four pairs of switch MOSFETs are altogether turned ON in the column switch CS0. Therefore, the upper two sets of complementary data lines $\underline{Dq}$ and $\underline{Dq}+1$ of the memory array MARY0 are connected to the complementary common data lines CD0 and CD1 as shown in FIG. 4 and the lower two sets of complementary data lines $\underline{Dr}$ and $\underline{Dr}+1$ are connected to the common complementary data lines $\overline{CD2}$ and $\overline{CD3}$. Needless to say, the following relation is established in the case of FIG. 4;

$$r = q + (n+1)/2$$

where n is the number of the complementary data lines in the memory array, q is the number of complementary data lines $\overline{Dq}$ in the memory array and r is the number of the complementary data lines $\overline{Dr}$ in the memory array.

The selection operation of the complementary data lines such as those described above is affected simultaneously in the memory mat MAT1 forming the pair, too. As a result, the upper two sets of complementary data lines $\overline{Dq}$ and $\overline{Dq+1}$ are connected to the complementary common data lines $\overline{CD4}$ and $\overline{CD5}$ and the lower two sets of complementary data lines $\overline{Dr}$ and $\overline{Dr+1}$ are connected to the complementary common data lines $\overline{CD6}$ and $\overline{CD7}$.

In other words, in the dynamic RAM of this embodiment, the memory array is divided substantially into eight memory arrays MARY0~MARY7 and although the memory arrays forming the pairs, i.e. MARY0 and MARY1~MARY6 and MARY7, are selectively activated, the complementary common data lines $\overline{CD0}$~$\overline{D3}$ and $\overline{CD4}$~$\overline{CD7}$ are all rendered effective simultaneously. Accordingly, utilization efficiency of each complementary common data line can be substantially improved and the number of installed necessary complementary common data lines can be reduced proportionally. As described above, the binary signals corresponding to the storage data of the (n+1) memory cells MC connected to the selected word line are altogether established in the complementary data lines $\overline{D0}$~$\overline{Dn}$ of each memory array, the simultaneous selection of the four sets of complementary data lines from each memory array such as in the dynamic RAM of this embodiment does not need any particular apparatuses in the memory arrays, sense amplifiers and row address decoders.

In FIG. 1, i-bit complementary internal address signals ay0~ayi−1 are supplied commonly from the column address decoder CAB to the column address decoders CD0~CD3, though this is not particularly limitative, the timing signals φy0 and φy1 are supplied commonly to the column address decoders CD0 and CD1 from the timing generation circuit, and the timing signals φy2 and φy3 are supplied commonly to the column address decoders CD2 and CD3, though this circuit construction is not particularly limitative. As typified by the column address decoder CD0 shown in FIG. 2, the column address decoders CD0~CD3 are equipped with (n+1)/2 unit decoder circuits UCD-0~UCDn−1 that are disposed in such a manner as to correspond to the switch MOSFET groups of the column switches CS0, CS1 through CS6, CS7, that is, to the data line selection signals YL0~YLn−1 described above, respectively. Here, symbol n represents the number of the complementary data lines in the memory array as described already. As typified by the unit decoder circuits UCD0 and UCDh in FIG. 2 and though not particularly limitative, each of these unit decoder circuits includes an i-input NAND gate circuit NAG1 or NAG2, and a pair of NOR gate circuits NOG1, NOG2 or NOG3, NOG4 that accept the output signal of the NAND gate circuit NAG1 or NAG2 at one of their input terminals.

The non-inversion internal address signals ay0~ayi−1 and the inversion internal address signals $\overline{ay0}$~$\overline{ayi-1}$ are supplied in the predetermined combination with vertical correspondence to the first through ith input terminals of the NAND gate circuits NAG1, NAG2, and the like. For example, the inversion internal address signals $\overline{ay0}$~$\overline{ayi-1}$ are supplied to the NAND gate circuits NAG1 and NAG2 corresponding to the data line selection signals YL0, YLh and YR0, RH, and the non-inversion internal address signals ay0~ayi−1 are supplied to the NAND gate circuits, not shown, corresponding to the data line selection signals YLh−2, YLn−1 and YRh−2, YRn−1. As a result, the output signals of these NAND gate circuits ar normally at the high level and are selectively set to the low level when the non-inversion internal address signals ay0~ayi−1 and the inversion internal address signals $\overline{ay0}$~$\overline{ayi-1}$ are altogether set to the high level in the corresponding combination.

The inversion signal of the timing signal φy0 described above by the inverter circuit N3, that is, the inversion timing signal $\overline{\phi y0}$, is supplied commonly to the other input terminal of each NOR gate circuit NOG1, NOG3, etc., corresponding to the memory array MARY0 of each unit decoder circuit UCD0~UCDn−1. The output signals of these NOR gate circuits are supplied to two pairs of corresponding switch MOSFETs of the column switch CS0 as the data line selection signals YL0~YLi−1. Similarly, the inversion signal of the timing signal φy1 by the inverter circuit N4, that is, the inversion timing signal $\overline{\phi y1}$, is supplied commonly to the other input terminal of each NOR gate circuit NOG2, NOG4, etc., corresponding to the memory array MARY1 of each unit decoder circuit UCD0~UCDn−1. The output signals of these NOR gate circuits are supplied as the data line selection signals YR0~YRi−1 to the corresponding two pairs of switch MOSFETs of the column switch CS1.

Accordingly, the output signals of the NOR gate circuits NOG1, NOG3, etc., that is, the data line selection signals YL0~YLi−1, are set to the high level selectively and simultaneously and in the combinations of the vertical correspondence relation when the inversion timing signal $\overline{\phi y0}$ is at the low level and the output signals of the corresponding NAND gate circuits NAG1 and NAG2, etc., are at the low level, or in other words, when the timing signal φy0 is at the high level and the non-inversion internal address signals ay0~ayi−1 as well as the inversion internal address signals $\overline{ay0}$~$\overline{ayi-1}$ are altogether set to the high level in the corresponding predetermined combinations. Similarly, the output signals of the NOR gate circuits NOG2, NOG4, etc., that is, the data line selection signals YR0~YRi−1, are set to the high level selectively and simultaneously and in the combination of the vertical correspondence relation when the inversion timing signal $\overline{\phi y1}$ is at the low level and the output signals of the corresponding NAND gate circuits NAG1, NAG2 and the like are at the low level or in other words, when the timing signal φy1 is at the high level and the non-inversion internal address signals ay0~ayi−1 as well as the inversion internal address signals $\overline{ay0}$~$\overline{ayi-1}$ are altogether set to the high level in the corresponding predetermined combinations.

When the timing signal φy0 or φy1 is at the high level, the column decoder CD1 exhibits the same decoding operation as that of the column address decoder CD0 as described above. When the timing signal φy2 or φy3 is at the high level, the column address decoder CD2 or CD3 exhibits the same decoding operation as that of the column address decoder CD0 or CD1 described above.

The column address buffer CAB fetches the Y address signals AY0~AYi supplied thereto on the time division basis through the external terminals A0~Ai in accordance with the timing signal φac supplied from the timing generation circuit TG and latches it. The buffer CAB also generates the complementary internal address signals av0~ayi on the basis of these Y address signals. Among these signals, the complementary internal address signal ayi of the most significant bit is supplied to the timing generation circuit TG and the other complementary internal address signals ay0~ayi−1 are supplied commonly to the column address decoders CD0~CD3.

The complementary common data lines (CD0, CD1), (CD2, CD3), (CD4, CD5) and (CD6, CD7) are connected to the corresponding main amplifiers MA0, MA1 (first main amplifiers), MA2, MA3 (second main amplifiers), MA4, MA5 (first main amplifiers) and MA6, MA7 (second main amplifiers), respectively, though this circuit arrangement is not particularly limitative. The timing signals φw and φr are supplied commonly from the timing generation circuit TG to these main amplifiers. Here, the timing signal φw is set temporarily to the high level at a predetermined timing when the dynamic RAM is in the write mode and under the selected state and the timing signal φr is set to the high level at a predetermined timing when the dynamic RAM is in the read mode and under the selected state.

Each of the main amplifiers MA0~MA7 includes a write amplifier and a read amplifier, not shown, though this is not particularly limitative. The input terminals of the write amplifiers of the main amplifiers MA0~MA7 are connected to the output terminals of the corresponding input buffers of the data input/output circuit, respectively, through the corresponding write signal lines wd0~wd7, though this arrangement is not particularly limitative, and their output terminals are connected to the corresponding complementary common data lines CD0~CD7, respectively. The timing signal φw described above is commonly supplied to these write amplifiers.

When the timing signal φw is at the high level, the write amplifiers of the main amplifiers MA0~MA7 are altogether and selectively operated. Under this operative state, each write amplifier generates a complementary write signal in accordance with the write data supplied from the corresponding input buffer of the input/output circuit I/O through the corresponding write signal line wd0~wd7 and transfers it to the corresponding complementary common data line CD0~CD7.

On the other hand, the input terminals of the read amplifiers of the main amplifiers MA0~MA7 are connected to the corresponding complementary common data lines CD0~CD7, though not particularly limited to this structure, and their output terminals are connected to the input terminals of the corresponding output buffers of the data input/output circuit I/O through the corresponding read signal lines rd0~rd7, respectively. The timing signal φr described already is supplied commonly to these read amplifiers.

When the timing signal φr is at the high level, the read amplifiers of the main amplifiers MA0~MA7 are activated selectively and altogether. Under this operative state, each read amplifier further amplifies the binary read signal outputted from the total eight memory cells brought into the selected state in the corresponding memory array through the corresponding complementary common data lines CD0~CD7, and transfers it to the corresponding output buffer of the data input/output circuit I/O through the read signal line rd0~rd7.

Each data input/output circuit I/O includes eight each input and output buffers (not shown), though this arrangement is not particularly limitative. Among these buffers, the timing signal ooe from the timing generation circuit TG is supplied commonly to each output buffer. Here, the timing signal ooe is raised to the high level at a predetermined timing when the dynamic RAM is in the read mode and under the selected state.

Each input buffer of the data input/output circuit I/O fetches and latches the write data supplied thereto through the corresponding data bus input/output terminals D0~D7 when the dynamic RAM is in the write mode. These write data are supplied to the write amplifiers of the corresponding main amplifiers MA0~MA7 through the corresponding write signal lines wd0~wd7, respectively.

Each output buffer of the data input/output circuit I/O is selectively activated when the timing signal φoe is at the high level. Under this operative state, each output buffer transfers the read signal, which is outputted from the read amplifier of each main amplifier MA0~MA7 through the corresponding read signal line rd0~rd7, from the corresponding data bus input/output terminal D0~D7.

The timing generation circuit TG generates the variety of timing signals described already in accordance with a row address strobe signal RAS, a column address strobe signal CAS, a write enable signal WE and a refresh control signal RF supplied thereto as the control signals from outside, and supplies them to each circuit. Thus, the main amplifiers are activated by timing signal φr and φw independently of the address signals. As described already, the timing generation circuit TG also generates selectively the timing signals φx0~φx3, φy0~φy3 and φpa0~φpa3 in accordance with the complementary internal address signals axi and ayi of the most significant bit. The control signal described above is used inside the timing generation circuit TG when it generates these timing signals.

FIG. 3 is a disposition diagram of the dynamic RAM in accordance with one embodiment of the present invention. The layout of the principal circuits on the semiconductor substrate SUB of the dynamic RAM of this embodiment will be explained with reference to this drawing. In the drawing, the principal circuits are drawn in the same way as the actual arrangement of them on the semiconductor substrate.

In FIG. 3, the dynamic RAM of this embodiment includes four memory mats MAT0~MAT3 which are arranged on the semiconductor substrate SUB and occupy the major proportion of the substrate area. As described already, the memory mats MAT0 and MAT2 form a pair while the memory mats MAT1 and MAT3 form another pair and they share commonly the corresponding four sets of complementary common data lines. As typically represented by the memory mat MAT0, each memory mat in this embodiment includes the column address decoder CD0~CD3 and is equipped with a pair of memory rays MARY0 and MARY1~MARY6 and MARY7, a pair of sense amplifiers SA0 and SA1~SA6 and SA7 and a pair of column switches CS0 and CS1~CS6 and CS7, each pair being disposed symmetrically with others with the column address decoder between them.

Of the four sets of complementary common data lines shared commonly by each pair of memory mats, two sets each are disposed in the corresponding column switches CS0 and CS1 through CS6 and CS7, respectively, and are moreover disposed in the mutually crossing arrangement at the intermediate portion of each memory mat in such a manner as to cross over the corresponding column address decoder. In other words, each pair of complementary common data lines are crossed once at the intermediate portion of the upper memory mat MAT0 or MAT1 and are crossed once again at the intermediate portion of the lower memory mat MAT2 or MAT3.

An intermediate side peripheral circuit PCM including the refresh counter RFC, the address multiplexer AMX and the row address buffer RAB is disposed at the intermediate portion between the upper memory mats MAT0, MAT1 and the lower memory mats MAT2, MAT3, though this arrangement is not particularly limitative. Furthermore, an upper side peripheral circuit PCU including the data input/output circuit I/O and the main amplifiers MA0~MA7 is disposed above the memory mats MAT0 and MAT1, though the arrangement is not particularly limitative, and a lower side peripheral circuit PCD including the column address buffer CAB and the timing generation circuit T is disposed further below the lower memory mats MAT2 and MAT3. These peripheral circuits include a plurality of corresponding bonding pads, though this is not particularly limitative.

As described above, the dynamic RAM of this embodiment employs the split array system and includes in total four sets of memory mats MAT0 and MAT1 and the memory mats MAT2 and MAT3 that form two sets of pairs, respectively. Each memory mat includes the column address decoder CD0~CD3 and includes also a pair of memory arrays MARY0 and MARY1~MARY6 and MARY7, a pair of row address decoders RD0 and RD1~RD6 and RD7, a pair of sense amplifiers SA0 and SA1~SA6 and sA7 and a pair of column switches CS0 and CS1~CS6 and CS7 whereby each pair is disposed in such a manner as to interpose the column address decoder CD0~CD3 between them. Two sets each of the memory arrays MARY0~MARY7 are activated selectively and simultaneously when the corresponding column address decoders, row address decoders and sense amplifiers are activated selectively in accordance with the address signals AXi and AYi of the most significant bit, that is, in accordance with the timing signals $\phi y0 \sim \phi y3$ and $\phi x0 \sim \phi x3$ and $\phi pa0 \sim \phi pa3$.

The dynamic RAM further includes four sets of complementary common data lines $\overline{CD0} \sim \overline{CD3}$ shared commonly by the pair of memory mats $\overline{MAT0}$ and MAT2 and four sets of complementary common data lines CD4~CD7 shared commonly by the pair of memory mats $\overline{MAT3}$ and MAT4, or eight sets in total. In this embodiment, the complementary common data lines CD0 and $\overline{CD1}$, CD2 and $\overline{CD3}$ and the complementary common data lines $\overline{CD4}$ and $\overline{CD5}$ and $\overline{CD6}$ and $\overline{CD7}$ are disposed in such a manner as to cross one another at the intermediate portions between the corresponding memory mats MAT0 and MAT2 and between the corresponding memory mats MAT1 and MAT3, or in other words, at the intermediate points of their extension direction. In the activated memory arrays on both sides of the intermediate point, two sets each of the designated complementary data lines, or eight sets in total, are connected selectively and simultaneously.

In other words, the dynamic RAM of this embodiment has eight memory arrays in total due to the array splitting and although two at a time at a time of them are activated selectively, four sets of complementary common data lines from each of the two activated memory arrays or eight complementary common data lines in total, i.e. CD0~CD7, are all selectively connected. As a result, utilization efficiency of each complementary common data line is improved equivalently and consequently, the number of complementary common data lines that must be disposed can be reduced. Therefore, since the necessary layout area of the complementary common data lines and the portions near the column switches inclusive of the switch MOSFET groups can be reduced and the multi-bit structure of the dynamic RAM can be promoted without inhibiting the reduction of its cost of reduction.

As illustrated in the embodiment described above, the dynamic RAM employing the split array system of this invention provides the following action and effects when applied to semiconductor memory device such as a dynamic RAM.

(1) In the dynamic RAM employing the split array system, the common data lines of two memory arrays disposed adjacent to each other to form a pair are mutually crossed at the intermediate point of their extension direction. A plurality of activated complementary data lines of the memory arrays are simultaneously connected to each common data line on both sides of, above and below the intermediate point. In this manner, the common data lines can be shared commonly by the two memory arrays forming the pair.

(2) Due to the effect (1) described above, utilization efficiency of the common data lines can be improved equivalently and the number of the common data lines which must be installed can be reduced.

(3) Due to the effects (1) and (2) described above, the necessary layout area of the common data lines and the column switch portions including the switch MOSFET groups can be reduced.

(4) Due to the effects (1) through (3) described above, the dynamic RAM employing the split array system and having a multi-bit structure can be accomplished without increasing the chip area or in other words, without hindering the reduction of its cost of production.

Although the present invention has thus been described definitely with reference to the embodiment thereof, the present invention is not particularly limited thereto but can of course be changed or modified in various manners without departing from the gist and scope thereof. For example, in FIG. 1, the numbers of and disposition of memory mats, memory arrays and peripheral circuits are arbitrary. Each memory mat may include individually the complementary common data lines. The column address decoder and row address decoder may be of a so-called "predecode system" which decodes in advance the corresponding complementary internal address signal by a predetermined bit number. The data input/output circuit I/O may be of a type which selectively makes the input/output operation of the stored data to and from the main amplifiers MA0~MA7. The X address signals AX~AXi and the Y address signals AY0~AYi may be inputted from the separate input terminals without employing the multiplex system.

The number of complementary data lines which are selected simultaneously in the activated memory array in FIG. 2 may be two sets or more than eight sets. In this case, the number of complementary common data lines must be set in accordance with the number of complementary data lines which are selected simultaneously. The position at which the complementary common data lines are crossed need not be the intermediate point in their extension direction and the number of crossings is not particularly limitative. The column address decoder may be shared by two memory mats MAT0 and MAT1 or two memory mats MAT2 and MAT3. In this case, so-called "column selection signal lines" must be disposed in order to transfer the data line selection signals from each column address decoder to the corresponding four memory arrays. The timing signals $\phi y0 \sim \phi y3$, $\phi x0 \sim \phi x3$ and $\phi pa \sim \phi pa3$ for selectively activating the column address decoders CD0~CD3, the row address decoders RD0~RD7 and the sense amplifiers SA0~SA7, respectively, need not essentially be generated by the address signals AXi and AYi of the uppermost bit, in particular.

In FIG. 3, the shape of the semiconductor substrate is arbitrary. If the complementary common data lines are not shared by the memory mats MAT0 and MAT2 and the memory mats MAT1 and MAT3, each memory mat may be disposed in a line or in a so-called "lateral arrangement". In this case, each peripheral circuit may be disposed concentratedly at the upper or lower side portion of the semiconductor substrate SUB. The bonding pads can be moved to the optimal positions in accordance with the package form of the dynamic RAM.

Furthermore, the block structure of the dynamic RAM shown in FIG. 1, the definite circuit constructions of the memory arrays and direct peripheral circuits shown in FIG. 2, the layout of the dynamic RAM shown in FIG. 3 and the combinations of the address signals and control signals may assume various forms and combinations.

Although the present invention has been described with primary reference to the application of the invention to the dynamic RAM which is the background, and the field of utilization, of the present invention, the present invention is not particularly limited thereto but can be applied to various semiconductor memory devices such as multi-port RAMs using Bi CMOS dynamic RAM and dynamic memory cells as the basic structure. The present invention can be applied widely to semiconductor memory devices employing at least the split array system and digital apparatuses including such semiconductor memory devices.

While a preferred embodiment has been set forth along with modifications and variations to show specific advantageous details of the present invention, further embodiments, modifications and variations are contemplated within the broader aspects of the present invention, all as set forth by the spirit and scope of the following claims.

I claim:

1. A semiconductor memory device comprising:
   first and second memory arrays each having memory data lines and memory cells, and said memory arrays being disposed adjacent to each other in such a manner as to form a pair;
   first and second common data lines disposed in such a manner as to cross one another at a predetermined position;
   switch means for selectively connecting said first common data lines to said memory data lines of some of the memory cells of said first memory array on one side of said predetermined position and to said memory data lines of some of the memory cells of said second memory array on the other side of said predetermined position;
   switch means for selectively connecting said second common data lines to said memory data lines of others of the memory cells of said first memory array on one side of said predetermined position and to memory said data lines of others of the memory cells of said second memory array on the other side of said predetermined position; and
   all of said switch means connecting each of said memory cells to only one of said common data lines.

2. A semiconductor memory device according to claim 1, including a common column address decoder between said first and second memory arrays and between said first and second common data lines, and switch means being activated by said column address decoder to selectively connect a plurality of said memory data lines to said first and second common data lines on both sides of said predetermined position.

3. A semiconductor memory device according to claim 2, wherein said semiconductor memory device is a dynamic RAM.

4. A semiconductor memory device according to claim 3, which further includes:
   first and second row address decoders and first and second sense amplifiers connected to said first and second memory arrays, respectively; and
   first and second main amplifiers connected to said first and second common data lines, respectively.

5. A semiconductor memory device according to claim 4, wherein said first and second memory arrays are selectively activated when said first and second row address decoders and said first and second sense amplifiers are selectively brought into the operative state in accordance with predetermined address signals, and said first and second main amplifiers are altogether activated independently of said address signals.

6. A semiconductor memory device according to claim 5, which further includes a plurality of memory mats each including said column address decoders and a pair each of memory arrays, row address decoders, sense amplifiers and column switches, and a plurality of pairs of main amplifiers.

7. A semiconductor memory device according to claim 6, wherein two each of said memory mats are disposed adjacent to each other in the extension direction of said common data lines in such a manner as to form a pair, and said common data lines are shared by two each of said memory mats forming said pair.

8. A semiconductor memory device according to claim 7, wherein four sets of said common data lines are connected to two each of said memory mats forming said pair.

9. A single chip integrated semi-conductor RAM, comprising:
   a substrate;
   a first memory array and an adjacent second memory array on said substrate;
   each of said memory arrays including word selection lines and memory data lines orthogonally arranged with said word selection lines, and a memory cell at the intersection of each memory data line with a word selection line;

a plurality of common data lines, on said substrate, a first portion of each of some of said common data lines being connected to a first group of said memory data lines of said first memory array respectively and a second portion of each of said some of said common data lines being connected to a first group of said memory data lines of said second memory array respectively;

a first portion of each of others of said common data lines being connected respectively to a second group of said memory data lines of said second memory array and different from said first group, and a second portion of each of said others of said common data lines being connected respectively to a second group of said memory data lines of said first memory array different from said first group;

each of said memory cells being connected to only one of said common data lines.

10. The RAM according to claim 9, wherein said first and second portions extend parallel to said word selection lines, with the first portions of said some of said common data lines being respectively aligned with said second portions of said others of said common data lines, and the second portions of aid some of said common data lines being respectively aligned with said first portions of said others of said common data lines.

11. The RAM according to claim 10, including a switch on said substrate between each data line and a corresponding common data line; and decoder means on said substrate between said first and second memory arrays for selectively activating said switches.

12. The RAM according to claim 11, wherein said first portions of said some of said common data lines and said second portions of said others of said common data lines are located between said decoder means and said first memory array; and said first portions of said others of said common data lines and said second portions of said some of said common data lines are located between said decoder means and said second memory array.

13. The RAM according to claim 12, wherein said common data lines each include connecting line portions respectively between said first and second portions; and said connecting line portions of said some of said common data lines crossing said connector line portions of said others of said common data lines.

14. The RAM according to claim 13, further including a plurality of sense amplifiers mounted on said substrate along the side of said first memory array opposite from said decoder means and mounted along the side of said second memory array opposite from said decoder means, said sense amplifiers being connected to said data lines; a plurality of main amplifiers connected to said common data lines, respectively and being mounted on said substrate; and selection line decoder means mounted on said substrate and connected to said selection lines, for each of said memory arrays.

15. The RAM according to claim 14, further including third and fourth memory arrays adjacent each other and adjacent said first and second memory arrays on said substrate, and being substantially identical to said first and second memory arrays;

additional common data lines mounted on said substrate and associated with said second and third memory arrays in substantially the identical manner as said common data lines of said first and second memory arrays;

each of said additional common data lines being a continuation of a respective one of said common data lines of said first and second memory arrays;

control means for selectively enabling said first and third memory arrays simultaneously with disabling said second and fourth memory arrays; and data bus means on said substrate having separate data lines respectively connected to each of said common data lines.

16. The RAM according to claim 10, wherein said common data lines each include connecting line portions respectively between said first and second portions; and said connecting line portions of said some of said common data lines crossing said connector line portions of said others of said common data lines.

17. The RAM according to claim 16, including control means for selectively enabling only one of said first and second memory arrays while simultaneously disabling the other.

18. The RAM according to claim 17, including a data bus on said substrate having data lines respectively connected to said common data lines.

19. The RAM according to claim 18, including a switch on said substrate between each data line and a corresponding common data line; decoder means on said substrate between said first and second memory arrays for selectively activating said switches, and wherein the number of common data lines between said decoder means and a memory array is no greater than one-half the number of data bus lines.

20. The RAM according to claim 9, including a switch on said substrate between each data line and a corresponding common data line; and decoder means on said substrate between said first and second memory arrays for selectively activating said switches.

21. The RAM according to claim 20, wherein said first portions of said some of said common data lines and said second portions of said others of said common data lines are located between said decoder means and said first memory array; and said first portions of said others of said common data lines and said second portions of said some of said common data lines are located between said decoder means and said second memory array.

22. The RAM according to claim 9, wherein said common data lines each include connecting line portions respectively between said first and second portions; and said connecting line portions of said some of said common data lines crossing said connector line portions of said others of said common data lines.

23. The RAM according to claim 20, further including a plurality of sense amplifiers mounted on said substrate along the side of said first memory array opposite from said decoder means and mounted along the side of said second memory array opposite from said decoder means, said sense amplifiers being connected to said data lines; a plurality of main amplifiers connected to said common data lines, respectively and being mounted on said substrate; and selection line decoder means mounted on said substrate and connected to said selection lines, for each of said memory arrays.

24. The RAM according to claim 9, including control means for selectively enabling only one of said first and second memory arrays while simultaneously disabling the other.

25. The RAM according to claim 9, including a data bus on said substrate having data lines respectively connected to said common data lines; a switch on said substrate between each data line and a corresponding common data line; and decoder means on said substrate between said first and second memory arrays for selectively activating said switches, wherein the number of common data lines between said decoder means and a memory array is no greater than one-half the number of data bus lines.

* * * * *